(12) United States Patent
Mauriac et al.

(10) Patent No.: US 7,612,387 B2
(45) Date of Patent: Nov. 3, 2009

(54) THYRISTOR OPTIMIZED FOR A SINUSOIDAL HF CONTROL

(75) Inventors: Christophe Mauriac, Veigne (FR); Samuel Menard, Tours (FR)

(73) Assignee: STMicroelectronics S.A., Montrouge (FR)

( * ) Notice: Subject to any disclaimer, the term of this patent is extended or adjusted under 35 U.S.C. 154(b) by 159 days.

(21) Appl. No.: 11/639,754

(22) Filed: Dec. 15, 2006

(65) Prior Publication Data

US 2007/0138502 A1 Jun. 21, 2007

(30) Foreign Application Priority Data

Dec. 16, 2005 (FR) .................................. 05 53914

(51) Int. Cl.
*H01L 29/74* (2006.01)
(52) U.S. Cl. .................. 257/107; 257/E29.211
(58) Field of Classification Search .......... 257/107, 257/157, 155, E29.211
See application file for complete search history.

(56) References Cited

U.S. PATENT DOCUMENTS

| 4,201,999 | A | * | 5/1980 | Howard et al. ............... 257/486 |
| 4,394,677 | A |  | 7/1983 | Jaecklin |
| 4,939,564 | A | * | 7/1990 | Asakura et al. ............... 257/146 |
| 4,994,884 | A | * | 2/1991 | Kato et al. ................... 257/123 |
| 5,134,082 | A | * | 7/1992 | Kirchgessner ............... 438/207 |
| 5,357,125 | A | * | 10/1994 | Kumagi ....................... 257/133 |
| 5,998,812 | A | * | 12/1999 | Bernier et al. ............... 257/157 |
| 6,175,143 | B1 | * | 1/2001 | Fujihira et al. ............... 257/471 |
| 6,423,986 | B1 |  | 7/2002 | Zhao |
| 2005/0224810 | A1 |  | 10/2005 | Ohno |

OTHER PUBLICATIONS

French Search Report from corresponding French Application No. 05/53914, filed Dec. 16, 2005.

* cited by examiner

*Primary Examiner*—Davienne Monbleau
*Assistant Examiner*—Eduardo A Rodela
(74) *Attorney, Agent, or Firm*—Lisa K. Jorgenson; William R. McClellan; Wolf, Greenfield & Sacks, P.C.

(57) ABSTRACT

A vertical thyristor adapted to an HF control, including a cathode region in a P-type base well, a lightly-doped P-type layer next to the base well, a lightly-doped N-type region in the lightly-doped P-type layer, a Schottky contact on the lightly-doped N-type region connected to a control terminal, and a connection between the lightly-doped N-type region and the P-type base well.

4 Claims, 1 Drawing Sheet

THYRISTOR OPTIMIZED FOR A SINUSOIDAL HF CONTROL

BACKGROUND OF THE INVENTION

1. Field of the Invention

The present invention relates to the forming of a thyristor optimized for a sinusoidal HF (high frequency) control.

2. Discussion of the Related Art

U.S. Pat. No. 6,862,196, which is incorporated herein by reference, provides a thyristor control structure such as illustrated in FIG. 1, comprising an HF voltage source connected via a transformer T to the gate-cathode circuit of a thyristor Th, a diode D1 being disposed in the gate-cathode circuit. Thyristor Th has a gate terminal G, an anode terminal A, and a cathode terminal K.

It is explained in the above US patent that, for a high enough frequency, a miniaturized transformer T formed on a glass substrate may be used. In this patent, examples of operating frequencies on the order of 40 MHz or more are given. Various advantages of this control mode are mentioned: transformer miniaturization, simplified assembly of the transformer and of the thyristor, improvement of the isolation, control of head-to-tail thyristors.

SUMMARY OF THE INVENTION

The present invention provides further increasing the frequency of the control signal up to values on the order of some hundred MHz or more, to further miniaturize transformer T.

The present invention more specifically provides a Schottky diode and thyristor integrated structure to enable an operation at such very high frequencies.

To achieve these and other objects, the present invention provides a vertical thyristor adapted to HF (high frequency) control, comprising a cathode region in a P-type base well, a lightly-doped P-type layer next to the base well, a lightly-doped N-type region in said lightly-doped P-type layer, a Schottky contact on the lightly-doped N-type region connected to a control terminal, and a connection between the lightly-doped N-type region and the P-type base well.

According to an embodiment of the present invention, the lightly-doped P-type layer also extends all around the base well and under the periphery thereof.

According to an embodiment of the present invention, the thyristor is formed from a lightly-doped N-type substrate, in which the doping level of the substrate is on the order of $10^{14}$ at./cm$^3$, the doping level of the lightly-doped P-type layer is on the order of $10^{15}$ at./cm$^3$, and the doping level of the lightly-doped N-type layer is on the order of $10^{16}$ at./cm$^3$.

According to an embodiment of the present invention, the connection between the lightly-doped N-type layer and the P-type base well is formed via a more heavily-doped N-type region formed in the lightly-doped N-type region.

The foregoing and other objects, features, and advantages of the present invention will be discussed in detail in the following non-limiting description of specific embodiments in connection with the accompanying drawings.

DETAILED DESCRIPTION

For clarity, as usual in the representation of semiconductor components, the elements of the various cross-section views are not drawn to scale.

Figure 1:
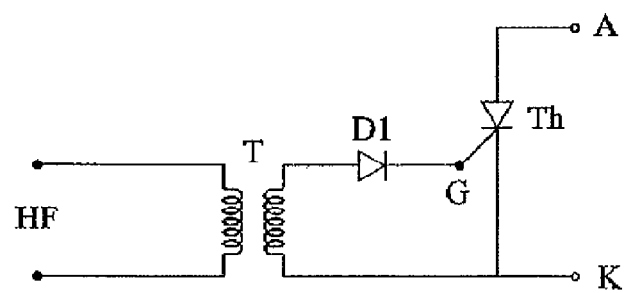
FIG. 1 shows an HF thyristor control circuit such as described in U.S. Pat. No. 6,862,196.

The present invention first provides replacing diode D1 of FIG. 1 with a Schottky diode to enable operation in very high frequency fields (100 MHz or more). On the other hand, it provides a structure integrating in monolithic fashion a thyristor and a Schottky diode.

Figure 2:
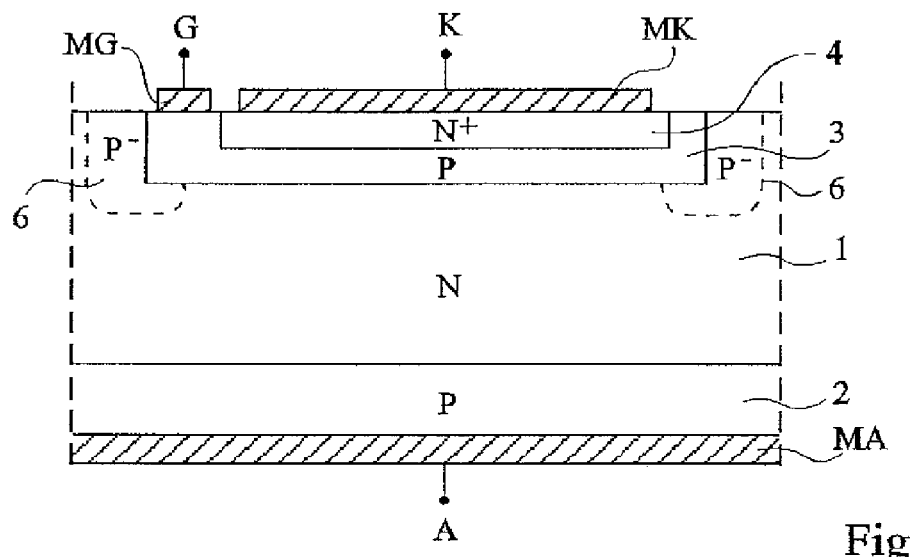
FIG. 2 is a simplified cross-section view of a conventional thyristor structure.

FIG. 2 is a cross-section view schematically showing the central portion of a conventional thyristor structure. This drawing is simplified. In particular, the peripheral structures that ensure a satisfactory breakdown voltage have not been shown.

The thyristor of FIG. 2 is formed from a lightly-doped N-type semiconductor substrate 1, currently silicon, comprising on its rear surface side a P-type anode layer 2 coated with a rear surface metallization MA connected to an anode terminal A. On its front surface side, a P-type well 3 is formed in substrate 1 and contains a heavily-doped N-type cathode region 4. A metallization MK is formed on cathode region 4 and is solid with a cathode terminal K. A gate metallization MG is formed on a portion of layer 3 and is connected to a gate terminal G.

As known by those skilled in the art, this structure may have various modifications and alterations to optimize the thyristor properties, according to whether the breakdown voltage, the dV/dt capability, the sensitivity . . . are desired to be favored. For example, to increase the breakdown voltage of a thyristor, it is known to surround well 3 with a P-type region 6 (shown in dotted lines in FIG. 2) more lightly-doped (P$^-$) than well 3 and deeper than said well.

Generally, the doping level of N-type substrate 1 is on the order of $10^{14}$ at./cm$^3$, the doping level of P-type regions 2 and 3, generally formed simultaneously, is on the order of $10^{18}$ at./cm$^3$, and the doping level of N$^+$-type region 4 is on the order of from $10^{20}$ to $10^{21}$ at./cm$^3$. For regions obtained by diffusion of dopants, said doping levels given in atoms/cm$^3$ correspond to doping levels in the vicinity of the apparent surfaces of the considered regions, the doping levels being substantially constant down to a depth substantially corresponding to two thirds of the depth of the considered area.

As indicated previously, the present invention aims at forming in monolithic form a Schottky diode connected like diode D1 in series with the gate terminal of a thyristor. For this Schottky diode to be biased in the right direction, the Schottky metallization must be formed of a lightly-doped N-type area. Thus, a solution which occurs to those skilled in the art is to insulate a portion of lightly-doped N-type substrate 1, and to form a Schottky contact on this substrate portion. However, such a solution requires delimiting a portion of the substrate with insulating walls, and this causes a significant silicon surface area consumption and thus increases the cost.

Figure 3:
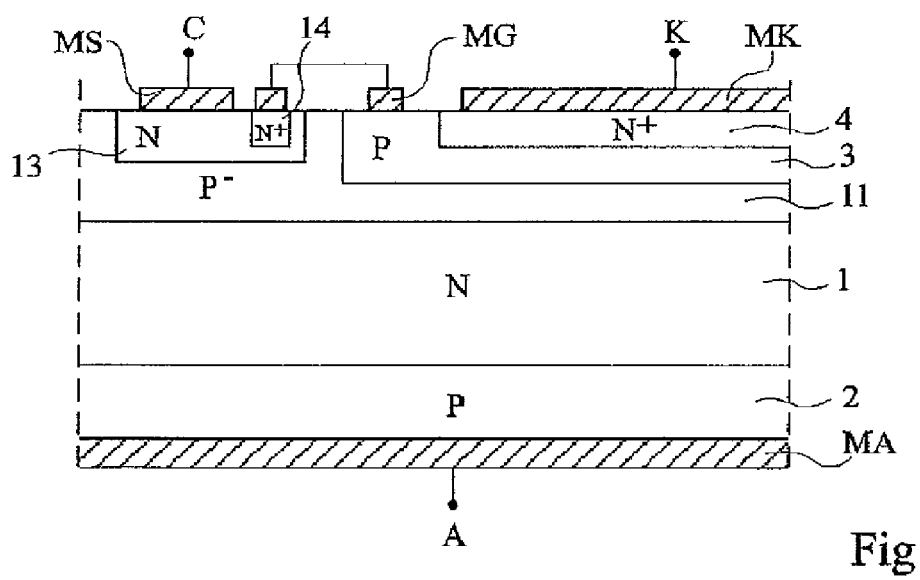
FIG. 3 is a simplified cross-section view of a structure integrating a thyristor and a Schottky control diode according to the present invention.

The present invention provides a much more economical solution in terms of silicon surface area, as schematically illustrated in the cross-section view of FIG. 3. In the right-hand portion of this drawing, the thyristor elements already described in relation with FIG. 2 are shown, that is, lightly-doped N-type substrate 1, P-type doped anode layer 2, rear surface metallization MA, anode terminal A, P-type layer 3 on the front surface side, heavily-doped N-type cathode layer 4, cathode metallization MK, cathode terminal K, and gate metallization MG. Further, according to the present invention, it is provided to form on the front surface side of the thyristor a lightly-doped P-type layer 11. Layer 11 is normally obtained by diffusion or by implantation-diffusion and is preferably deeper than P-type well 3. It thus extends under P-type well 3, or under the periphery of this well, and on either side of this well. An advantage of providing layer 11 to be deeper than P-type well 3 is that this enables improving the thyristor breakdown voltage, as indicated hereabove. Thus, in the case of some high-voltage thyristors, the use of a lightly-doped P-type layer 11 in the context of the present invention does not increase the number of manufacturing steps.

A lightly-doped N-type region 13 is formed in P-type region 11 next to well 3. A Schottky contact is formed on this N-type region 13 by the deposition of a selected metallization MS connected to a control terminal C. Also, an ohmic contact is taken on N-type region 13, for example, by providing a more heavily-doped N-type region 14, connected to metallization MG. Terminal C then effectively corresponds to the anode of a Schottky diode in series with the thyristor gate.

With this structure, a Schottky diode of satisfactory characteristics can be obtained while maintaining the doping levels of a conventional thyristor, that is, a doping level on the order of $10^{14}$ at./cm$^3$ for substrate 1, a doping level on the order of $10^{18}$ at./cm$^3$ for P-type regions 2 and 3, generally formed simultaneously, and a doping level on the order of from $10^{20}$ to $10^{21}$ at./cm$^3$ for N$^+$-type region 4. Lightly-doped P-type layer 11 can then be formed with a doping level on the order of $10^{15}$ at./cm$^3$, and N-type region 13 can be formed with a doping on the order of $10^{16}$ at./cm$^3$. This order of magnitude ($5.10^{15}$ to $5.10^{16}$ at./cm$^3$) of the doping level of region 13 is quite compatible with the forming of a Schottky diode of good quality, having its Schottky contact formed of titanium, platinum/nickel, nickel, or the like.

The existence of a P-type portion next to and possibly under P-type well 3 does not modify the thyristor characteristics and the maintaining of P-type well 3 with the same doping and the same characteristics as in the prior art thyristor of FIG. 2 enables keeping the characteristics desired for a thyristor formed according to tried and tested technologies.

Various alterations, modifications, and improvements of the present invention will readily occur to those skilled in the art. Although, in a preferred embodiment, it is preferred to form layer 11 by diffusion or implantation/diffusion, it may be provided, in technologies where epitaxial depositions are provided, for layer 11 to result from an epitaxy. This enables further optimizing the desired doping level of the N-type region 13 forming the cathode of a Schottky diode.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical thyristor adapted to an HF control, comprising a cathode region in a P-type base well, and comprising:
   a lightly-doped P-type layer next to the base well,
   a lightly-doped N-type region in said lightly-doped P-type layer,
   a Schottky contact on the lightly-doped N-type region connected to a control terminal, and
   a connection between the lightly-doped N-type region and the P-type base well, wherein the connection between the lightly-doped N-type region and the P-type base well is formed via a more heavily-doped N-type region formed in the lightly-doped N-type region.

2. The thyristor of claim 1, wherein the lightly-doped P-type layer also extends under the periphery of the base well.

3. The thyristor of claim 1, formed from a lightly-doped N-type substrate, wherein the doping level of the substrate is on the order of $10^{14}$ at./cm3, the doping level of the lightly-doped P-type layer is on the order of $10^{15}$ at./cm3, and the doping level of the lightly-doped N-type region is on the order of $10^{16}$ at./cm3.

4. A vertical thyristor comprising:
   a semiconductor substrate;
   an anode region on a rear surface of the semiconductor substrate;
   a cathode region in a P-type base well on a front surface of the semiconductor substrate;
   a lightly-doped P-type layer next to the P-type base well;
   a lightly-doped N-type region in the lightly-doped P-type layer;
   a Schottky contact on the lightly-doped N-type region, the Schottky contact connected to a control terminal; and
   a connection between the lightly-doped N-type region and the P-type base well, wherein the connection between the lightly-doped N-type region and the P-type base well includes a more heavily-doped N-type region in the lightly-doped N-type region.

* * * * *